United States Patent
Takita et al.

(10) Patent No.: US 12,253,636 B2
(45) Date of Patent: Mar. 18, 2025

(54) PHOTOELECTRIC CONVERSION PANEL, X-RAY PANEL, AND IMAGING APPARATUS

(71) Applicant: Sharp Display Technology Corporation, Kameyama (JP)

(72) Inventors: Rikiya Takita, Kameyama (JP);
Fumiki Nakano, Kameyama (JP);
Makoto Nakazawa, Kameyama (JP);
Hiroyuki Moriwaki, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 404 days.

(21) Appl. No.: 17/827,087

(22) Filed: May 27, 2022

(65) Prior Publication Data

US 2022/0390624 A1    Dec. 8, 2022

(30) Foreign Application Priority Data

Jun. 3, 2021 (JP) ................. 2021-093795

(51) Int. Cl.
*G01T 1/20* (2006.01)
*H01L 27/146* (2006.01)

(52) U.S. Cl.
CPC ........ *G01T 1/2004* (2013.01); *G01T 1/20182* (2020.05); *H01L 27/14612* (2013.01); *H01L 27/14663* (2013.01)

(58) Field of Classification Search
CPC ............... G01T 1/2004; G01T 1/20182; H01L 27/14612; H01L 27/14663
See application file for complete search history.

(56) References Cited

U.S. PATENT DOCUMENTS

| | | |
|---|---|---|
| 2007/0012954 A1 | 1/2007 | Murayama |
| 2008/0245968 A1* | 10/2008 | Tredwell ............. G01T 1/20183 250/370.09 |
| 2009/0190017 A1* | 7/2009 | Ono ...................... H04N 25/63 348/308 |
| 2010/0059804 A1* | 3/2010 | Hayashi ............ H01L 27/14663 257/292 |
| 2011/0180714 A1* | 7/2011 | Okada ..................... G01T 1/243 250/354.1 |
| 2012/0018627 A1* | 1/2012 | Tredwell ........... H01L 27/14663 378/207 |
| 2012/0080726 A1* | 4/2012 | Sakano ............. H01L 27/14645 438/57 |
| 2020/0052017 A1* | 2/2020 | Hua .................. H01L 27/14663 |

FOREIGN PATENT DOCUMENTS

| | | | | |
|---|---|---|---|---|
| JP | 2007-027318 A | 2/2007 | | |
| WO | WO-2009011465 A1 * | 1/2009 | ........... | G01T 1/2928 |
| WO | WO-2015076080 A1 * | 5/2015 | ........... | G01T 1/2006 |
| WO | WO-2018016345 A1 * | 1/2018 | ........... | G01T 1/2018 |

* cited by examiner

*Primary Examiner* — Mark R Gaworecki
(74) *Attorney, Agent, or Firm* — ScienBiziP, P.C.

(57) ABSTRACT

A photoelectric conversion panel includes multiple thin-film transistors (TFTs) formed on an substrate, photodiodes respectively connected to the TFTs, and a metal layer formed on a light incident side of the photodiodes. The metal layer is formed in a position to overlap a subset of the photodiodes in a plan view.

9 Claims, 12 Drawing Sheets

PHOTOELECTRIC CONVERSION PANEL, X-RAY PANEL, AND IMAGING APPARATUS

BACKGROUND

1. Field

The present disclosure relates to a photoelectric conversion panel, an X-ray panel, and an imaging apparatus.

2. Description of the Related Art

Photoelectric conversion panels, X-ray panels, and imaging apparatuses are disclosed. For example, Japanese Unexamined Patent Application Publication No. 2007-27318 discloses a photoelectric conversion panel, an X-ray panel, and an imaging apparatus.

A solid-state imaging apparatus disclosed in Japanese Unexamined Patent Application Publication No. 2007-27318 includes a semiconductor substrate and a shield layer. The semiconductor substrate includes a charge storage region formed close to a surface of the semiconductor substrate and a light incident region that reads a signal charge accumulated in the charge storage region. The shield layer is formed on a top side of the semiconductor substrate and manufactured of a conductive material that surrounds the light incident region. The solid-state imaging apparatus also includes a support arranged on or above the shield layer and manufactured of a conductive material and a protective glass arranged on the support. Static electricity, if created on the protective glass, is drained to the outside of the semiconductor substrate via the support and the shield layer.

When the solid-state imaging apparatus disclosed in Japanese Unexamined Patent Application Publication No. 2007-27318 is examined, characteristics of an element (photoelectric conversion element) mounted on the light incident region are measured in a state where the light incident region is not irradiated with light. In such a case, a measurer performs an operation to mount a shading member on the light incident region and the operation typically takes time.

It is desirable to provide a photoelectric conversion panel, an X-ray panel, and an imaging apparatus that reduce a workload of a measurer when the measurer measures characteristics of a photoelectric conversion element.

SUMMARY

According to a first aspect of the disclosure, there is provided a photoelectric conversion panel including: a substrate; a plurality of transistors formed on the substrate; a plurality of photoelectric conversion elements respectively connected to the transistors; and a metal layer that is formed on a light incident side of the photoelectric conversion elements and arranged in an position where the metal layer overlaps a subset of the photoelectric conversion elements in a plan view.

According to a second aspect of the disclosure, there is provided an X-ray panel including: the photoelectric conversion panel according to the first aspect; and a scintillator that emits fluorescence when the scintillator is irradiated with X-rays, wherein the metal layer is arranged between the photoelectric conversion elements and the scintillator.

According to a third aspect of the disclosure, there is provided an imaging apparatus including: the photoelectric conversion panel according to the first aspect; and a detector that detects a leakage current of at least one of the photoelectric conversion elements arranged in a position where the photoelectric conversion elements overlap the metal layer in a plan view.

DESCRIPTION OF THE EMBODIMENTS

Figure 1:
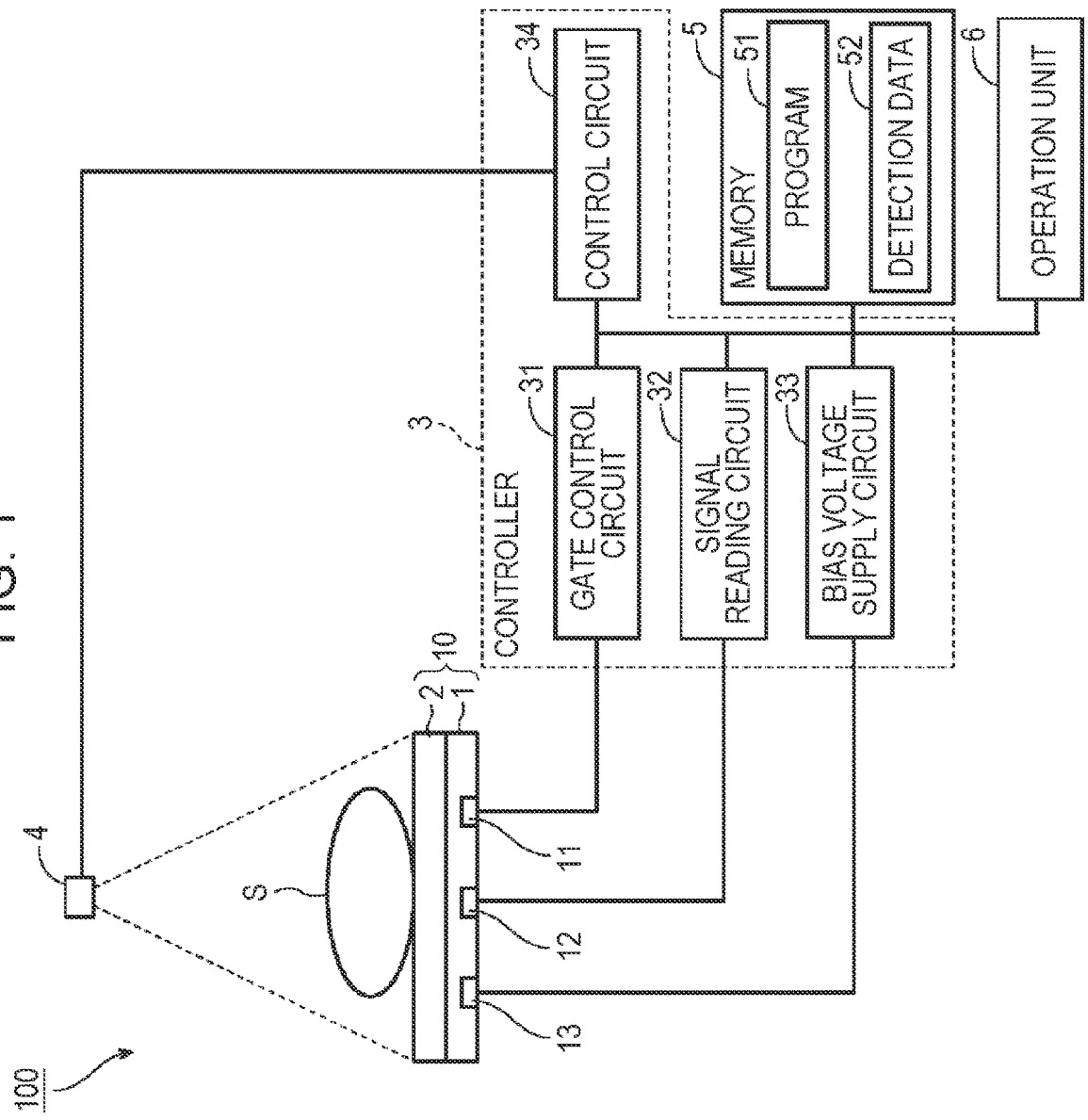
FIG. 1 schematically illustrates an X-ray imaging apparatus including an X-ray panel including an photoelectric conversion panel in accordance with a first embodiment.

Embodiments of the disclosure are described with reference to the drawings. The disclosure is not limited to the embodiments described below. The embodiments may be appropriately modified without departing from the scope of the disclosure. In the discussion that follows, like elements or elements having the same function are designated with the same reference numerals throughout different drawings and the discussion thereof are not repeated. Configurations in the embodiments and modifications of the embodiments may be combined or changed without departing from the scope of the disclosure. For easier understanding, the configurations may be simplified or clarified in the drawings, and some of components in each configuration may be omitted. The components in the drawings are not necessarily drawn according to the actual dimensional ratio.

First Embodiment

Configuration of X-ray Imaging Apparatus

FIG. 1 illustrates an X-ray imaging apparatus 100 including an X-ray panel 10 having a photoelectric conversion panel 1 of a first embodiment. The X-ray imaging apparatus 100 includes the X-ray panel 10 including the photoelectric conversion panel 1 and a scintillator 2, a controller 3, an X-ray source 4, a memory 5, and an operation unit 6.

Referring to FIG. 1, the controller 3 includes a gate control circuit 31, a signal reading circuit 32, a bias voltage supply circuit 33, and a control circuit 34. The gate control circuit 31 is connected to a gate terminal 11 of the photoelectric conversion panel 1. The signal reading circuit 32 is connected to a data terminal 12. The bias voltage supply circuit 33 is connected to a bias terminal 13. The control circuit 34 is connected to the gate control circuit 31, the signal reading circuit 32, the bias voltage supply circuit 33, the X-ray source 4, the memory 5, and the operation unit 6.

The X-ray source 4 emits X rays to a subject S. X rays transmitted through the subject S are converted into fluorescence (hereinafter referred to as "scintillation light") by the scintillator 2 placed on the photoelectric conversion panel 1. The X-ray imaging apparatus 100 generates an X-ray image by picking up the scintillation light with the X-ray panel 10.

The memory 5 includes a non-volatile memory (such as a random-access memory (RAM)). The memory 5 stores a program 51 to be executed by the control circuit 34 and detection data 52 to be stored on the control circuit 34. The detection data 52 is described below in greater detail.

The operation unit 6 includes a touch panel receiving an operation of a user or an operation panel having multiple operation buttons. The operation unit 6 receives an operation of the user who selects between a "standard imaging mode" and a "detection and correction mode."

In the standard imaging mode, with the subject S placed between the X-ray source 4 and the X-ray panel 10, an X-ray image is created with the X-ray source 4 emitting the X rays on the X-ray panel 10. In the detection and correction mode, a series of control processes are performed. The series of control processes include detecting the magnitude of a leakage current in accordance with a data signal acquired by a photodiode 14 shaded by a metal layer 40 described below and correcting, in accordance with the magnitude of the detected leakage current, the magnitude of a read voltage acquired via a data line 12a.

Figure 2:
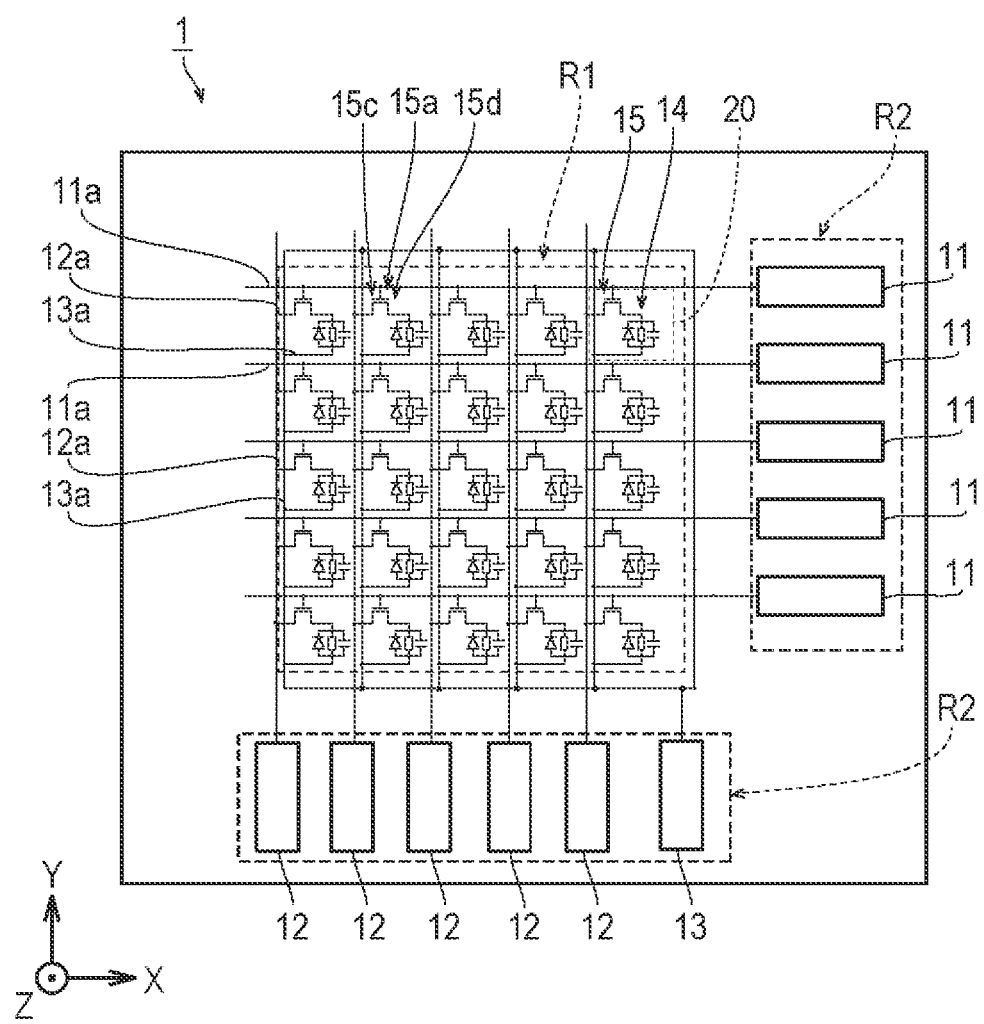
FIG. 2 is a plan view schematically illustrating the photoelectric conversion panel.

FIG. 2 is a plan view schematically illustrating the photoelectric conversion panel 1. The photoelectric conversion panel 1 includes multiple gate terminals 11, multiple data terminals 12, a bias terminal 13, multiple photodiodes 14, and multiple thin-film transistors (TFTs) 15. Formed on a substrate 101 (see FIG. 4) of the photoelectric conversion panel 1 are multiple gate lines 11a that respectively connect the gate electrodes 15a of the TFTs 15 to the gate terminals 11, multiple date lines 12a that respectively connect source electrodes 15c of the TFTs 15 to the data terminals 12, and a bias line 13a connected to the photodiodes 14.

Referring to FIG. 2, the photoelectric conversion panel 1 includes a pixel region R1 and terminal regions R2. The pixel region R1 is rectangular in a plan view. The pixel region R1 includes multiple pixels 20 defined by multiple gate lines 11a and multiple data lines 12a. The terminal regions R2 are respectively formed on a positive side of the pixel region R1 in an X direction and on a negative side of the pixel region R1 in a Y direction and the gate terminals 11, the data terminals 12 and the bias terminal 13 are formed on the terminal regions R2.

Referring to FIG. 2, the gate lines 11a and the data lines 12a are formed in the pixel region R1 such that the gate lines 11a intersect the data lines 12a. Multiple pixels 20 are thus arranged in a matrix in a plan view. For example, bias lines 13a are formed along the data lines 12a. Each pixel 20 includes a photodiode 14 and a TFT 15. The photodiodes 14 and the TFTs 15 are arranged in a matrix in a plan view.

Referring to FIG. 2, the gate terminals 11 are arranged side by side in the Y direction in the terminal region R2. The data terminals 12 and the bias terminal 13 are arranged side by side in the X direction in the terminal region R2. The gate terminals 11 convey gate signals from the gate control circuit 31 to the gate lines 11a. The data terminals 12 apply read voltage from the signal reading circuit 32 to the data lines 12a. The data terminals 12 acquires data signals from the photodiodes 14 via the data lines 12a and the TFTs 15 and convey the acquired data signals to the signal reading circuit 32. The bias terminal 13 supplies a bias voltage from the bias voltage supply circuit 33 to the bias lines 13a.

Figure 3:
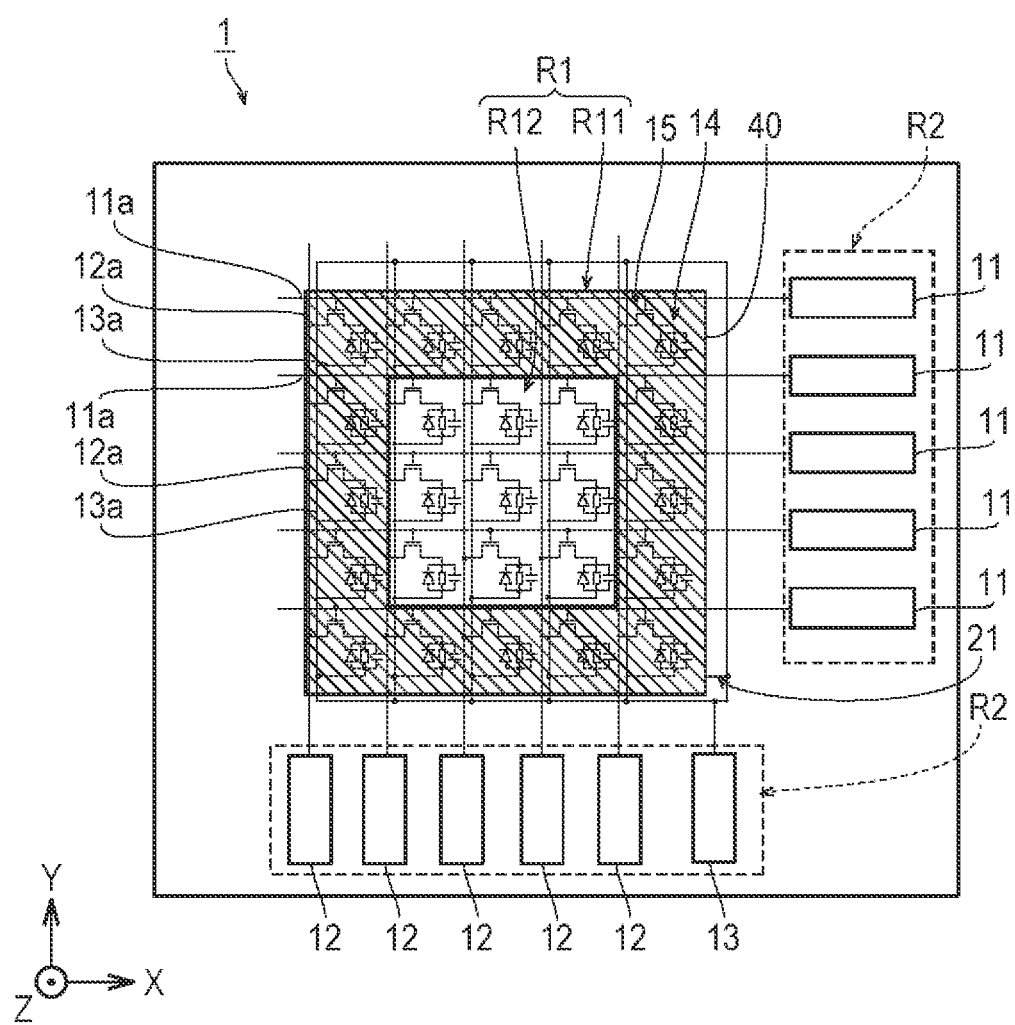
FIG. 3 is a plan view of the photoelectric conversion panel illustrating a mounting location of a metal layer.

FIG. 3 is a plan view of the photoelectric conversion panel 1 and illustrates the mounting location of a metal layer 40. Referring to FIG. 3, the metal layer 40 is formed in a position where the metal layer 40 overlaps a subset of the photodiodes 14 in a plan view. By partially reflecting or absorbing at least part of the scintillator light traveling from the scintillator 2 to the photodiodes 14, the metal layer 40 shades the photodiodes 14 arranged in the overlapping position in a plan view. The metal layer 40 includes but is not limited to aluminum as a metallic material having a shading property. FIG. 3 illustrates the photodiodes 14 that are arranged in the position where the photodiodes 14 overlap the metal layer 40 in a plan view.

Referring to FIG. 3, the pixel region R1 includes an external edge region R11 and an imaging region R12 inside the external edge region R11. The external edge region R11 includes edge portions on the positive side and the negative side of the pixel region R1 in the X direction and edge portions on the positive side and the negative side of the pixel region R1 in the Y direction. The metal layer 40 is formed in a position where the metal layer 40 overlaps multiple photodiodes 14 arranged in the external edge region R11 out of the photodiodes 14. The metal layer 40 is also formed as a frame that surrounds the imaging region R12 in a plan view. The metal layer 40 in this configuration does not shade the photodiodes 14 arranged in the imaging region R12 used for imaging. As a result, this configuration may thus preclude the metal layer 40 from affecting imaging performance of the photoelectric conversion panel 1.

Referring to FIG. 3, the metal layer 40 is electrically connected to the bias lines 13a via a joint section 21. This configuration provides the function of a short ring. Even when static electricity enters one of the metal layer 40 and the bias line 13a, the short ring diffuses the static electricity to the other of the metal layer 40 and the bias line 13a. The joint section 21 is formed outside the pixel region R1.

For convenience of explanation, referring to FIG. 3, the metal layer 40 is formed such that the metal layer 40 overlaps in a plan view the photodiodes 14 at the one outermost columns and one outermost rows, out of the multiple photodiodes 14 arranged in a matrix. The disclosure is not limited to this configuration. For example, the metal layer 40 may be formed such that the metal layer 40 overlaps in a plan view the photodiodes 14 at several tens of outermost columns and several tens of outermost rows out of the multiple photodiodes 14. Referring to FIG. 3, the photodiodes 14 in the imaging region R12 are arranged in a matrix of three columns and three rows. Alternatively, the photodiodes 14 may be arranged in in a matrix of four or more columns and four or more rows.

Figure 4:
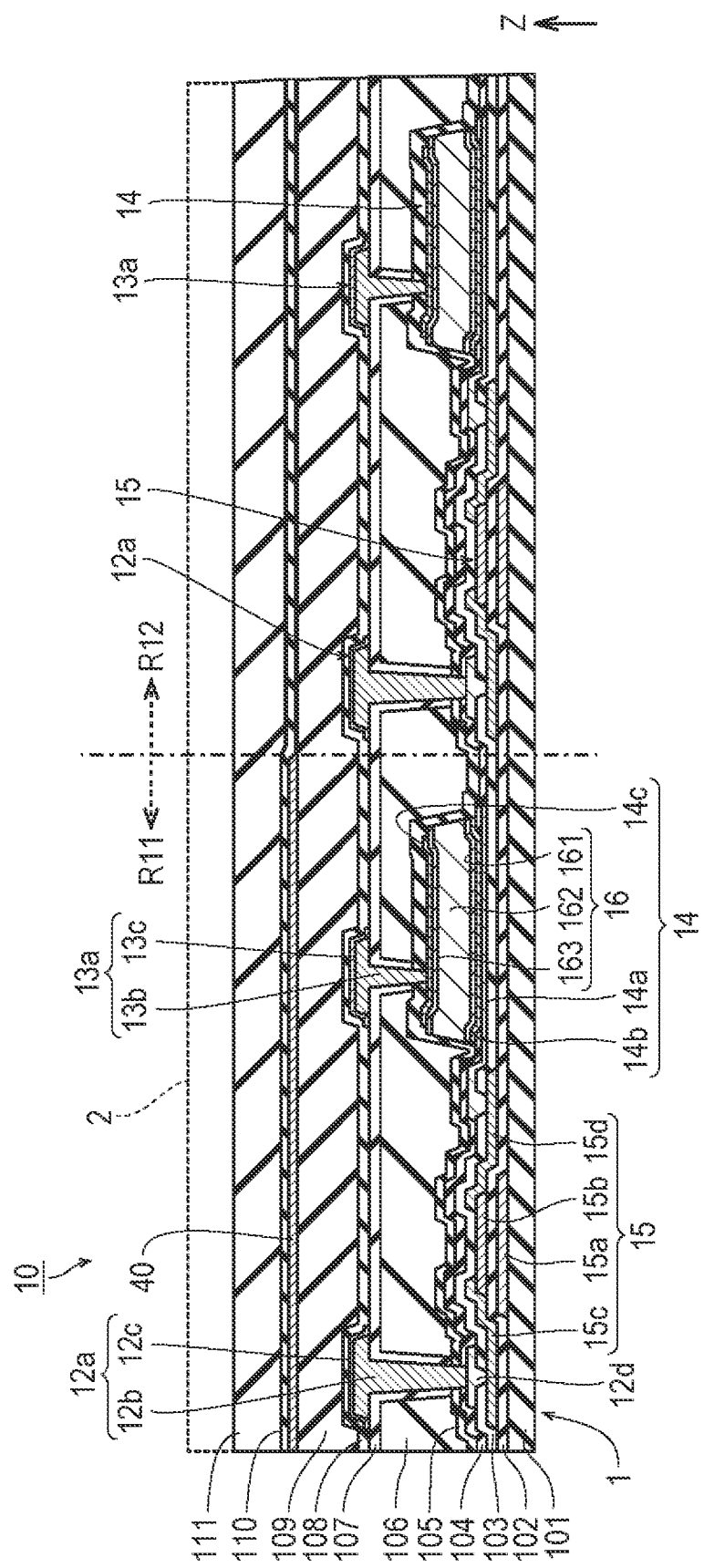
FIG. 4 is a cross-sectional view of a border portion between an external edge region and an imaging region of the X-ray panel.

FIG. 4 is a cross-sectional view of a border portion between the external edge region R11 and the imaging region R12 of the X-ray panel 10. The photodiode 14 includes a first lower electrode 14a, a second lower electrode 14b, an upper electrode 14c, and a photoelectric conversion layer 16. The photoelectric conversion layer 16 is arranged between the second lower electrode 14b and the upper electrode 14c. In the imaging region R12, the scintillation light from the scintillator 2 enters the photoelectric conversion layer 16 and the photoelectric conversion layer 16 converts the incident scintillation light into charge. In the external edge region R11, the scintillation light is blocked by the metal layer 40.

Referring to FIG. 4, the TFT 15 includes a gate electrode 15a, a semiconductor active layer 15b, a source electrode 15c, and a drain electrode 15d. The drain electrode 15d and the second lower electrode 14b are connected to each other via the first lower electrode 14a. The data line 12a includes two layers formed of a lower data electrode 12b and an upper data electrode 12c. The data line 12a is connected to the source electrode 15c via a joint electrode 12d. The bias line 13a includes two layers formed of a lower bias electrode 13b and an upper bias electrode 13c. The bias line 13a is connected to the upper electrode 14c.

Referring to FIG. 4, the photoelectric conversion panel 1 includes the substrate 101, and a first insulator film 102 through a tenth insulator film 111. The gate electrode 15a is formed on the substrate 101. The substrate 101 is electrically insulative. The gate electrode 15a is formed as a lamination film manufactured of tungsten W and tantalum nitride TaN. The first insulator film 102 covers the gate electrode 15a. The first insulator film 102 is formed by laminating an insulator film of silicon oxide $SiO_2$ as an upper layer and an insulator film of silicon nitride $SiN_x$ as a lower layer. The semiconductor active layer 15b, the source electrode 15c, and the drain electrode 15d are formed above the gate electrode 15a with the first insulator film 102 interposed therebetween.

The semiconductor active layer 15b is manufactured of oxide semiconductor. The oxide semiconductor may be InGaO3(ZnO)5, magnesium oxide zinc MgxZn1-xO, cadmium oxide zinc CdxZn1-xO, cadmium oxide CdO, InSnZnO (including indium In, tin Sn, and zinc Zn), indium In—aluminum Al—zinc Zn—oxygen O based semiconductor, or amorphous oxide semiconductor containing indium In, gallium Ga and zinc Zn at a predetermined ratio. The oxide semiconductor may be an amorphous material or a crystalline material (such as a polycrystal material, a microcrystal material, or a c-axis oriented material). In the case of a lamination structure, any combination of materials is acceptable (any specific combination is not excluded). According to the first embodiment, the semiconductor active layer 15b is amorphous oxide semiconductor containing indium In, gallium Ga, and zinc Zn at a predetermined ratio. The semiconductor active layer 15b, if manufactured of oxide semiconductor containing indium In, gallium Ga, zinc Zn, and oxygen O, may reduce a leakage current of the TFTs 15, leading to a higher signal to noise (S/N) ratio than amorphous silicon a-Si. A higher sensitivity sensor may thus result.

Referring to FIG. 4, the source electrode 15c and the drain electrode 15d are formed on the same layer. the source electrode 15c and the drain electrode 15d have a three-layer lamination structure by interposing a metal film of aluminum Al between two metal films of titanium Ti. The second insulator film 103 (passivation film) is formed as an upper film on or above the first insulator film 102 in a manner such that the second insulator film 103 covers the source electrode 15c and the drain electrode 15d. For example, the second insulator film 103 is manufactured of silicon oxide $SiO_2$.

The first lower electrode 14a and the joint electrode 12d are formed on or above the second insulator film 103. The first lower electrode 14a and the joint electrode 12d has a three-layer lamination structure that is formed by interposing a metal film of aluminum Al between two metal films of titanium Ti. The third insulator film 104 is formed to cover part of the first lower electrode 14a and part of the second insulator film 103. The second lower electrode 14b is formed to cover part of the first lower electrode 14a. For example, the second lower electrode 14b is manufactured of titanium Ti.

The photoelectric conversion layer 16 is formed on the second lower electrode 14b. The photoelectric conversion layer 16 is formed by laminating an n-type amorphous semiconductor layer 161, an intrinsic amorphous semiconductor layer 162, and a p-type amorphous semiconductor layer 163 in that order. The n-type amorphous semiconductor layer 161 is manufactured of amorphous silicon that is doped with an n-type impurity (such as phosphorus). The intrinsic amorphous semiconductor layer 162 is manufactured of intrinsic amorphous silicon. The intrinsic amorphous semiconductor layer 162 is formed in contact with the n-type amorphous semiconductor layer 161. The p-type amorphous semiconductor layer 163 is manufactured of amorphous silicon that is doped with a p-type impurity (such as boron). The p-type amorphous semiconductor layer 163 is formed in contact with the intrinsic amorphous semiconductor layer 162. The disclosure is not limited to this lamination order. For example, the lamination order of n-type semiconductor (+n), intrinsic semiconductor (i), and p-type semiconductor (+p) may be +p/i/+n or +n/i/+p. The upper electrode 14c is formed on or above the photoelectric conversion layer 16. The upper electrode 14c is manufactured of indium tin oxide ITO.

The fourth insulator film 105 is formed to cover at least part of each of the photodiode 14 and the third insulator film 104. The fourth insulator film 105 covers the side surface of the photodiode 14 and part of the top surface of the photodiode 14. The fourth insulator film 105 is manufactured of silicon nitride $SiN_x$.

The fifth insulator film 106 covers at least part of the fourth insulator film 105. The fifth insulator film 106 is a planarization film that covers the photodiode 14 and planarizes steps formed by the photodiode 14. For example, the fifth insulator film 106 is manufactured of an organic material. The fifth insulator film 106 covers at least part of the fourth insulator film 105. The sixth insulator film 107 is an inorganic film that covers at least part of the fifth insulator film 106. The data line 12a and the bias line 13a are formed on the sixth insulator film 107. The lower data electrode 12b of the data line 12a and the lower bias electrode 13b of the bias line 13a have a three-layer lamination structure that is formed by interposing a metal film of aluminum Al between two metal films of titanium Ti. For example, the upper data electrode 12c of the data line 12a and the upper bias electrode 13c of the bias line 13a are manufactured of, for example, ITO.

The seventh insulator film 108 is formed to cover the data line 12a and the bias line 13a. For example, the seventh insulator film 108 is manufactured of silicon nitride $SiN_x$. The eighth insulator film 109 covers the seventh insulator film 108. For example, the eighth insulator film 109 is manufactured of an organic material.

Referring to FIG. 4, the metal layer 40 is formed above the photodiode 14 (formed on a light incident side from the photodiode 14) in the external edge region R11. The metal layer 40 is not formed in the imaging region R12. For example, the metal layer 40 is formed on the eighth insulator film 109. The ninth insulator film 110 is formed to cover the metal layer 40. For example, the ninth insulator film 110 is manufactured of silicon nitride $SiN_x$. The tenth insulator film 111 is formed to cover the ninth insulator film 110. For example, the tenth insulator film 111 is manufactured of an organic material. The scintillator 2 is formed on or above the tenth insulator film 111. In this way, the metal layer 40 may protect the photodiode 14 from static electricity that enters through the top surface of the photoelectric conversion panel 1 when the scintillator 2 is deposited.

In the configuration described above, the metal layer 40 may shade the photodiodes 14 in the external edge region R11. As a result, when characteristics of the photodiodes 14 are measured, a measurer may be free from an operation to mount a shading member onto the photoelectric conversion panel 1. The workload of the measurer may thus be reduced. Even when static electricity enters the photoelectric conversion panel 1, the metal layer 40 may diffuse the static electricity and may thus control a damage to the TFTs 15 and the photodiodes 14 possibly caused by the static electricity. The metal layer 40, serving as a shading member, may control an increase in the number of components in the photoelectric conversion panel 1 while reducing the workload of the measurer.

Figure 5:
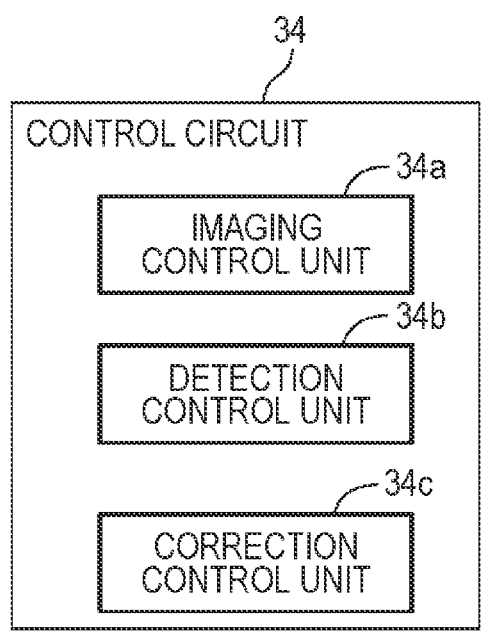
FIG. 5 is a functional block diagram of a control circuit.

FIG. 5 is a functional block diagram of the control circuit 34. The control circuit 34 includes a processor that executes a program 51 stored on the memory 5. By executing the program 51, the control circuit 34 functions as an imaging control unit 34a, a detection control unit 34b, and a correction control unit 34c.

When a "standard imaging mode" is selected by the operation unit 6, the imaging control unit 34a causes the X-ray source 4 to emit X rays and generates an X-ray image in response to a data signal acquired from the signal reading circuit 32. For example, with the photodiodes 14 in the imaging region R12 applied with a bias voltage via the bias line 13a, the X rays transmitted through the subject S are converted into charge responsive to an amount of the scintillation light as a result of conversion of the scintillator 2. The photodiodes 14 convey signals responsive to the charges (data signal) to the TFTs 15. The imaging control unit 34a causes the gate control circuit 31 to successively and sequentially supply the gate signal to each gate line 11a. The TFT 15 applied with the gate signal is turned on. When the TFT 15 is turned on with the data line 12a applied with a read voltage from the signal reading circuit 32, a signal (data signal) responsive to the charge converted by the photodiode 14 is applied to the read voltage. The signal reading circuit 32 thus acquires the data signal. The imaging control unit 34a thus generates the X-ray image in response to the data signal from each pixel 20 in the imaging region R12.

When a "detection and correction mode" is selected by the operation unit 6, the detection control unit 34b causes the X-ray source 4 to emit the X rays and acquires the data signal from the photodiodes 14 arranged in the external edge region R11 and the imaging region R12. The data signal detected from the external edge region R11 shaded by the metal layer 40 has a waveform responsive to the magnitude of a leakage current in one of the states of the photodiodes 14 in which no scintillation light is emitted. In response to the acquired data signal, the detection control unit 34b detects the magnitude of the leakage current. The X rays emitted by the X-ray source 4 may possibly pass through the metal layer 40 and affect a threshold voltage of the TFT 15. As described above, by detecting the leakage current in accordance with the data signal with the X rays emitted, the effect of the X rays may be reflected on a correction value in a correction operation as described below. The detection control unit 34b stores on the memory 5 the magnitude of the leakage current as the detection data 52 (see FIG. 1). In this configuration, the reading of the detection data 52 from the memory 5 detects two types of signals, namely, a signal generated on the photodiodes 14 overlapping the metal layer 40 in a plan view and a signal generated on the photodiodes 14 not overlapping the metal layer 40 in a plan view.

In accordance with the detection data 52, the correction control unit 34c corrects the height of the read voltage acquired from the data lines 12a. For example, as the magnitude of the leakage current is larger, the correction control unit 34c sets the read voltage to a lower value. The leakage current acquired from the photodiodes 14 varies depending on characteristics and aging of the photodiodes 14 and an effect directly caused by the X rays. In the configuration described above, the height of the read voltage to be applied to the data lines 12a is corrected depending on the acquired leakage current. The effect on imaging quality, caused by the characteristics and aging of the photodiodes 14 and by the effect directly caused by the X rays, may be reduced.

Control Process of X-ray Imaging Apparatus

Figure 6:
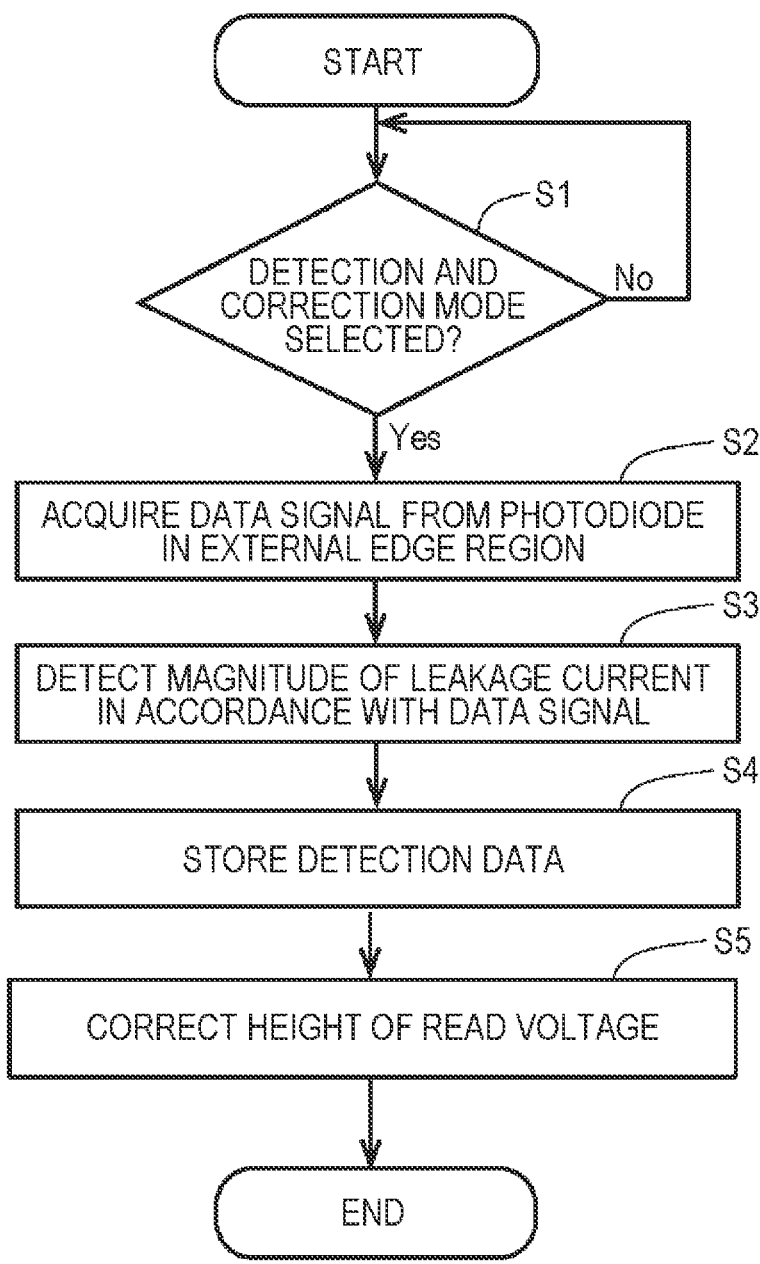
FIG. 6 is a flowchart illustrating a control process of the X-ray imaging apparatus in a detection and correction mode.

A control process of the X-ray imaging apparatus 100 is described with reference to FIG. 6. FIG. 6 is a flowchart of the control process of the X-ray imaging apparatus 100 in the detection and correction mode. The description of the control process in the standard imaging mode is omitted herein. The control process of the X-ray imaging apparatus 100 is performed by the controller 3.

In step S1, the controller 3 determines whether the detection and correction mode has been selected. If the detection and correction mode has been selected, the controller 3 proceeds to step S2.

In step S2, the X-ray source 4 emits the X rays and the data signal is acquired from the photodiodes 14 in the external edge region R11. In step S3, the magnitude of the leakage current is detected in response to the data signal. In step S4, the detection data 52 responsive to the magnitude of the leakage current is stored on the memory 5. In step S5, the height of the read voltage is corrected in accordance with the detection data 52. The control process in the detection and correction mode thus ends.

Second Embodiment

Figure 7:
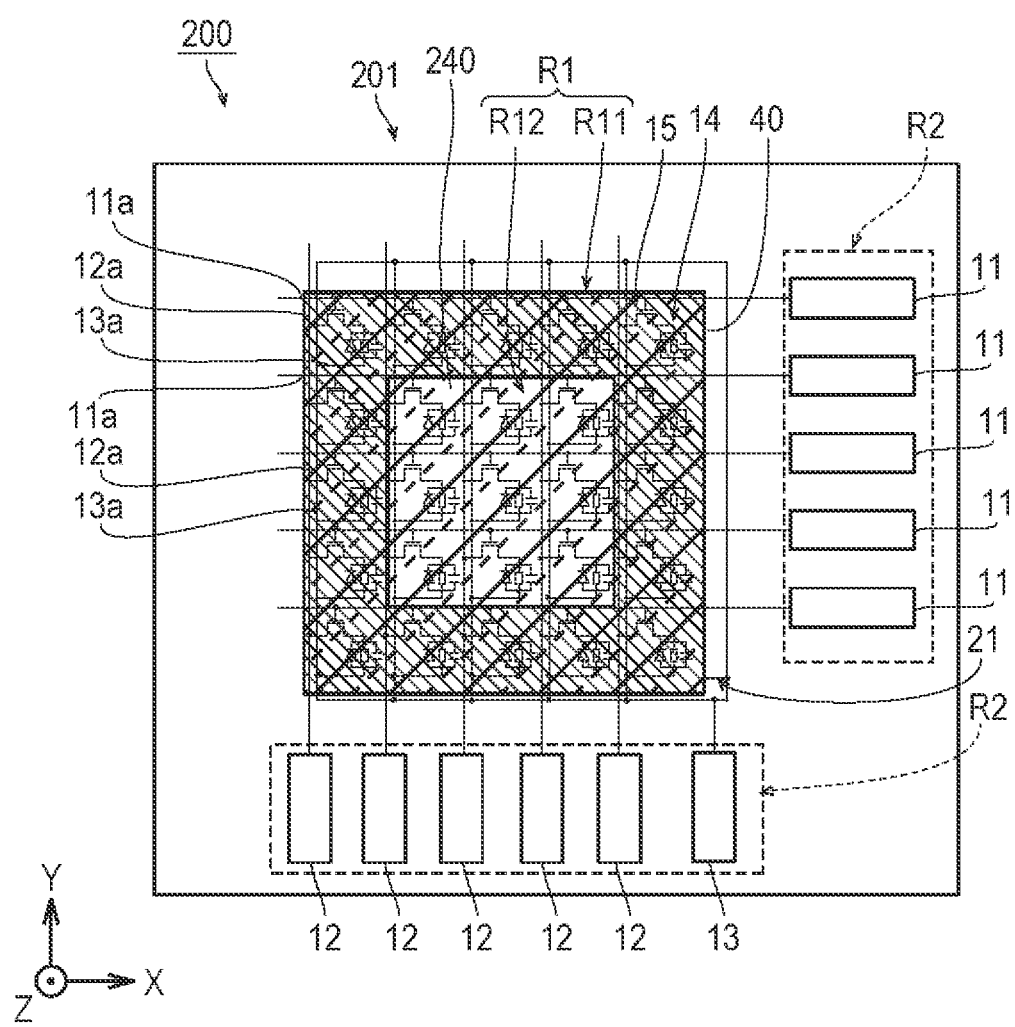
FIG. 7 is a plan view of a photoelectric conversion panel of an X-ray imaging apparatus of a second embodiment.
Figure 8:
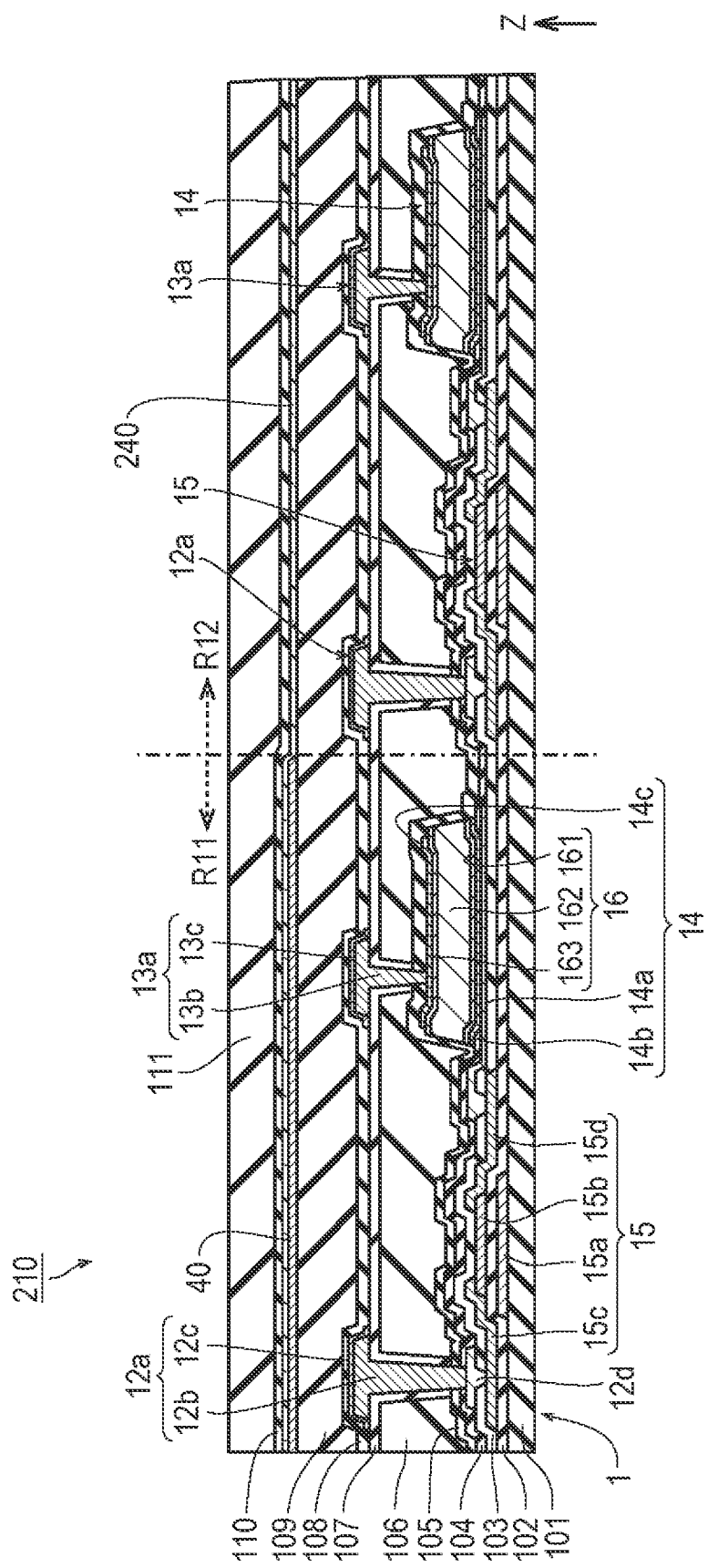
FIG. 8 is a cross-sectional view of part of the photoelectric conversion panel of the second embodiment.

The configuration of an X-ray imaging apparatus 200 of the second embodiment is described below with reference to FIGS. 7 and 8. FIG. 7 is a plan view of a photoelectric conversion panel 201 of an X-ray imaging apparatus 200 of the second embodiment. FIG. 8 is a cross-sectional view of the photoelectric conversion panel 201 of the second embodiment. The elements in the second embodiment identical in configuration to those in the first embodiment are designated with the same reference numerals and the discussion thereof is omitted herein.

Referring to FIG. 7, the X-ray imaging apparatus 200 of the second embodiment includes a transparent electrode layer 240 covering the pixel region R1. Specifically, the transparent electrode layer 240 continuously expands throughout an area that overlaps the photodiodes 14 in the imaging region R12 and an area that overlaps the photodiodes 14 in the external edge region R11. For example, the transparent electrode layer 240 contains ITO.

Referring to FIG. 8, the transparent electrode layer 240 is formed on or above the metal layer 40. For example, the transparent electrode layer 240 is laminated on and electrically connected to the metal layer 40. Even when static electricity enters one of the transparent electrode layer 240 and the metal layer 40, the static electricity may be diffused to the other of the transparent electrode layer 240 and the metal layer 40. Since the transparent electrode layer 240 is arranged in a position where the transparent electrode layer 240 overlaps the photodiodes 14 in the imaging region R12 in a plan view, the photodiodes 14 in the imaging region R12 may be protected from static electricity. Since the scintillation light is transmitted through the transparent electrode layer 240, light from the scintillator 2 may be incident on the photodiodes 14 in the imaging region R12. The other configuration and effect of the second embodiment are identical to those of the first embodiment.

Third Embodiment

Figure 9:
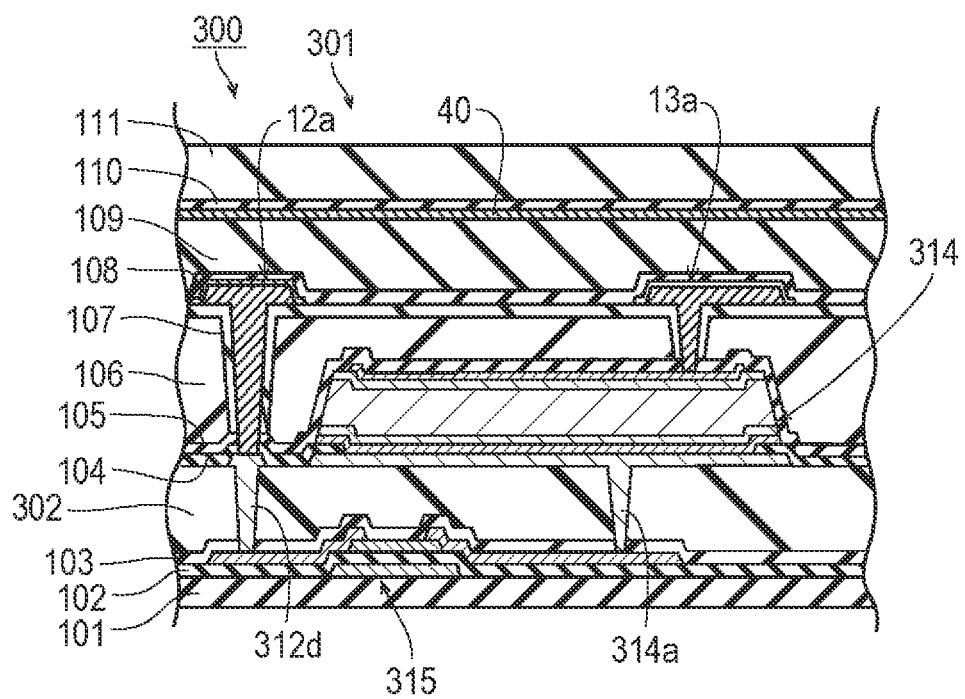
FIG. 9 is a cross-sectional view of part of a photoelectric conversion panel of an X-ray imaging apparatus of a third embodiment.

The configuration of an X-ray imaging apparatus 300 of a third embodiment is described below with reference to FIG. 9. FIG. 9 is a cross-sectional view of part of a photoelectric conversion panel 301 of the X-ray imaging apparatus 300 of the third embodiment. The elements in the third embodiment identical in configuration to the elements in the first and second embodiments are designated with the same reference numerals and the discussion thereof is omitted herein.

Referring to FIG. 9, a planarization film 302 is formed beneath or below photodiodes 314 and on or above TFTs 315 in the photoelectric conversion panel 301 of the X-ray imaging apparatus 300 of the third embodiment. The planarization film 302 is formed to cover the second insulator film 103 (passivation film) covering the TFTs 315 and planarizes unevenness of the top surface of the second insulator film 103 caused by the TFTs 315. The photodiode 314 and the TFT 315 are connected to each other via a lower electrode 314a formed in a contact hole arranged in the planarization film 302. The data line 12a and the TFT 315 are connected to each other via a joint electrode 312d formed in a contact hole arranged in the planarization film 302. With the planarization film 302 arranged, the photodiode 314 and the TFT 315 are arranged in an overlapping position in a plan view. The photodiode 314 may thus be arranged above the TFT 315, permitting a larger area of the photodiode 314 per unit pixel. As a result, the photoelectric conversion panel 301 may have higher sensitivity performance. The other configuration and effect of the third embodiment are identical to those of the first and second embodiments.

Fourth Embodiment

Figure 10:
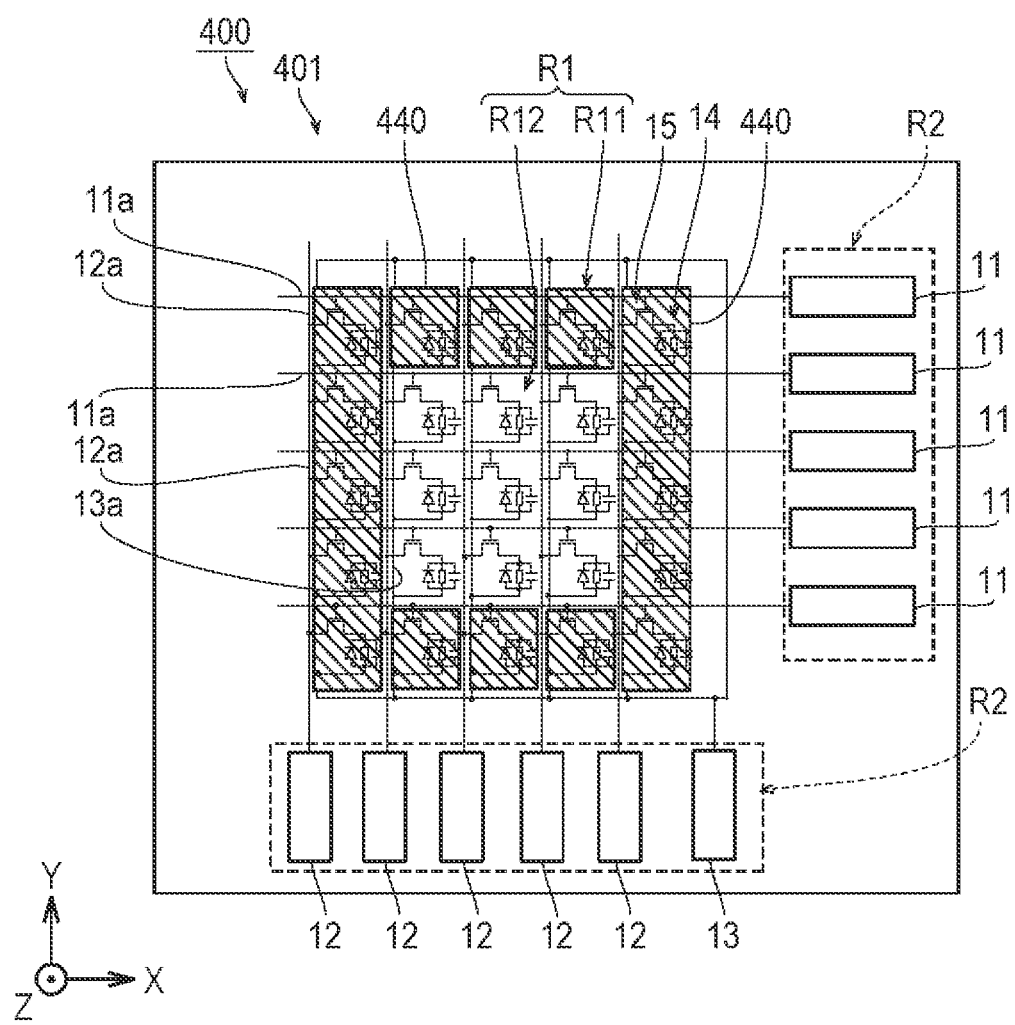
FIG. 10 is a plan view of a photoelectric conversion panel of an X-ray imaging apparatus of a fourth embodiment.
Figure 11:
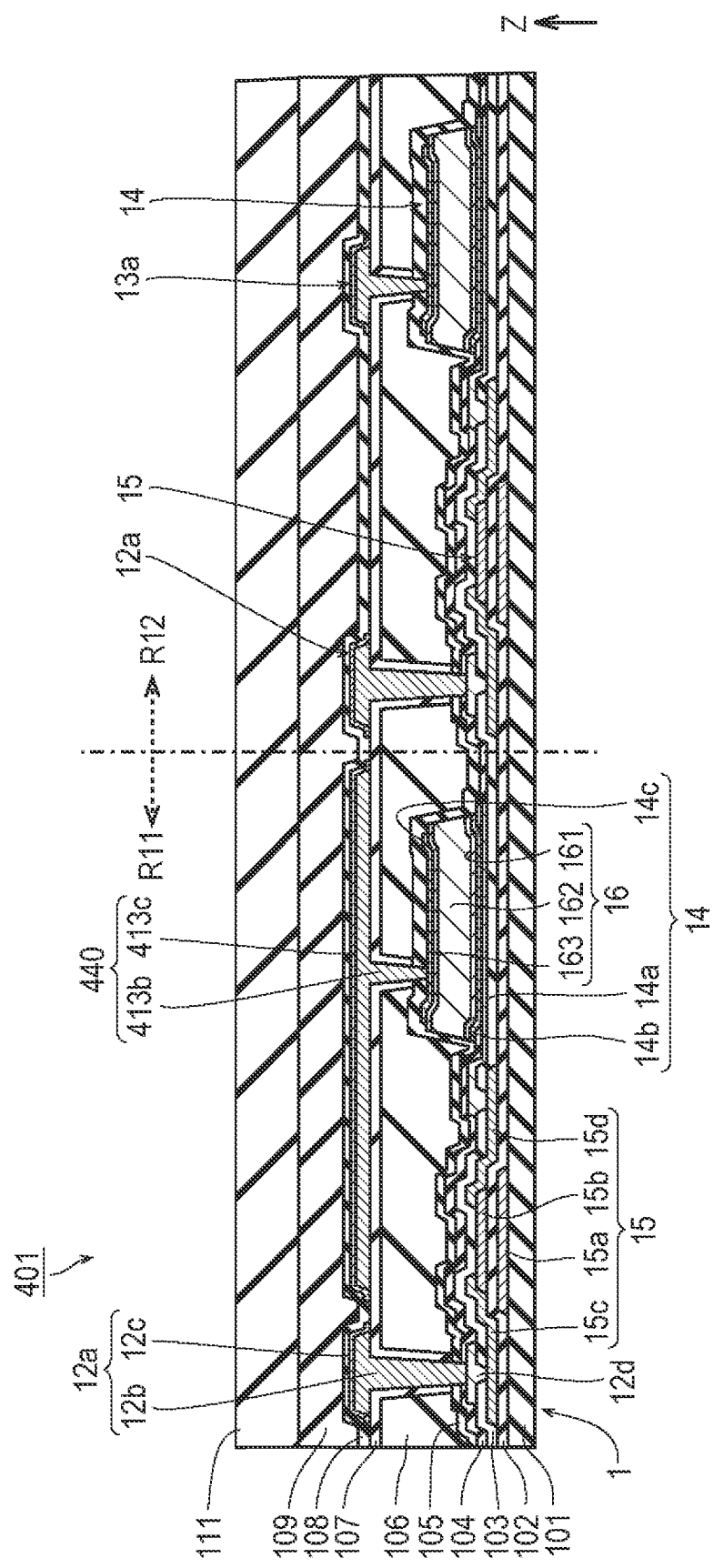
FIG. 11 is a cross-sectional view of a border portion between an external edge region and an imaging region of the photoelectric conversion panel of the fourth embodiment.

The configuration of an X-ray imaging apparatus 400 of a fourth embodiment is described with reference to FIGS. 10 and 11. FIG. 10 is a plan view of an photoelectric conversion panel 401 of the X-ray imaging apparatus 400 of the fourth embodiment. FIG. 11 is a cross-sectional view of part of the photoelectric conversion panel 401 of the X-ray imaging apparatus 400 of the fourth embodiment. The elements in the fourth embodiment identical to the elements in the first through third embodiments are designated with the same reference numerals and the discussion thereof are omitted herein.

Referring to FIG. 10, the photoelectric conversion panel 401 of the X-ray imaging apparatus 400 of the fourth embodiment includes multiple metal layers 440 that are arranged on the same layer as the bias lines 13a and formed integrally with the bias lines 13a. Referring to FIG. 11, metal layers 440 are formed to cover the photodiodes 14 in the external edge region R11 and the bias lines 13a are connected to the photodiodes 14 in the imaging region R12. The metal layers 440 are formed apart from the data lines 12a. In this way, the metal layers 440 are not short-circuited to the data lines 12a. Each metal layer 440 includes a lower metal layer 413b formed on the same layer as the lower bias electrode 13b and an upper metal layer 413c formed on the same layer as the upper bias electrode 13c. The metal layers 440 is connected to the photodiodes 14 in the external edge region R11 and serves as a bias line for the photodiodes 14 in the external edge region R11. If the threshold voltage of the TFT 15 shifts in response to the scintillation light, the bias lines 13a may shade the photodiodes 14 and the TFTs 15. According to the fourth embodiment, since a new metal layer is not added to the layer forming the bias lines 13a, an increase in the number of layers and an increase in the number of manufacturing steps may be controlled. As a result, costs involved in producing the photoelectric conversion panel 401 may be reduced. Since the metal layers of the first through fourth embodiments are not spaced apart from the data lines 12a, the degree of shading may be increased. The other configuration and effect of the fourth embodiment remain unchanged from those of the first through third embodiments.

The embodiments have been described. The embodiments serve only as examples that embody the disclosure. The disclosure is not limited the embodiments. The embodiments may be modified or changed without departing from the scope of the disclosure.

Figure 12:
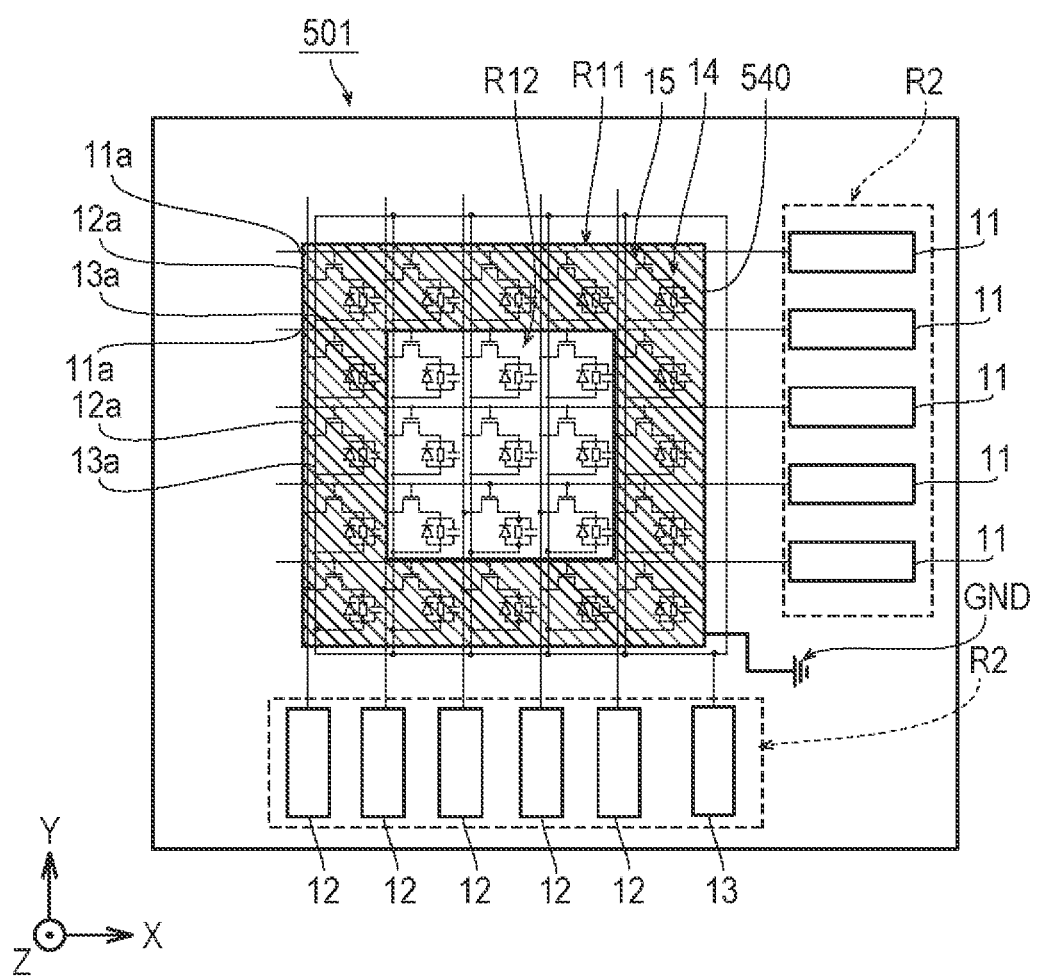
FIG. 12 is a plan view of a photoelectric conversion panel of a modification of each of the first through third embodiments.

(1) According to the first through third embodiments, the metal layer is connected to the bias line. The disclosure is not limited to this configuration. Alternatively, a metal layer 540 in a photoelectric conversion panel 501 is connected to ground GND in a modification of the first and second embodiments as illustrated in FIG. 12.

(2) According to the first through fourth embodiments, the photoelectric conversion panel is applied to the X-ray panel for the X-ray imaging apparatus. The disclosure is not limited to this configuration. Specifically, the photoelectric conversion panel may be applied to a panel serving as a sensor of light other than X rays.

(3) According to the first through fourth embodiments, examples of the materials of the layers (films) forming the photoelectric conversion panel are described. The disclosure is not limited to the materials quoted. The layers (films) of the photoelectric conversion panel may be manufactured of materials other than those described above.

(4) According to the first through fourth embodiments, the metal layer is formed in the external edge region R11. The disclosure is not limited to this example. Alternatively, the metal layer may be formed in part of an internal region inside the external edge region R11.

(5) According to the first through fourth embodiments, the metal layer is formed as a frame in a plan view. The disclosure is not limited to this metal layer. Alternatively, the metal layer may be formed in a line shape or a rectangular shape in a plan view.

(6) According to the second embodiment, the transparent electrode is formed on or above the metal layer. The disclosure is not limited to this configuration. Specifically, the transparent electrode may be formed beneath or below the metal layer.

(7) According to the second embodiment, the transparent electrode is formed to cover the pixel region. The disclosure is not limited to this configuration. For example, the metal layer may be formed only in the imaging region or only in the external edge region.

(8) According to the first through fourth embodiments, the magnitude of the leakage current is detected. The disclosure is not limited to this configuration. The characteristics other than the leakage current in the photodiodes shaded by the metal layer or the TFTs connected to the photodiodes may be detected (examined).

(9) According to the first through fourth embodiments, the height of the read voltage is corrected in accordance with the magnitude of the leakage current (detection data). The disclosure is not limited to this setting. For example, the pixel values of the X-ray image may be corrected in accordance with the detection data.

(10) According to the fourth embodiment, the photodiodes are shaded by causing a subset of the bias lines to cover the photodiodes as illustrated in FIG. 11. The disclosure is not limited to this configuration. For example, the photodiodes may be shaded by causing a subset of the data lines to cover the photodiodes. An increase in parasitic capacitance of the data lines conveying the data signals may not be desirable. Effect on the data signal (imaging performance) is more controlled and shading is more effectively performed when the bias lines shade the photodiodes as in the fourth embodiment than when the data lines shade the photodiodes.

The photoelectric conversion panel, the X-ray panel, and the imaging apparatus may also be described as below.

According to a first configuration of the disclosure, there is provided a photoelectric conversion panel including: a substrate; a plurality of transistors formed on the substrate; a plurality of photoelectric conversion elements respectively connected to the transistors; and a metal layer that is formed on a light incident side of the photoelectric conversion elements and arranged in a position where the metal layer overlaps a subset of the photoelectric conversion elements in a plan view (first configuration).

According to the first configuration, the metal layer may shade the subset of the photoelectric conversion elements. To measure the characteristics of the photoelectric conversion elements, a measurer simply measures the shaded subset of the photoelectric conversion elements and is thus free from an operation to mount a shading member on the photoelectric conversion panel. As a result, the workload of the measurer may be reduced. Even when static electricity enters the photoelectric conversion panel, the metal layer may diffuse the static electricity. The transistors or the photoelectric conversion elements on the substrate may be protected from damage attributed to static electricity. Since the metal layer also serves as the shading member, an increase in the number of components in the photoelectric conversion panel may be controlled while the workload of the measurer may be reduced.

According to the first configuration, the photoelectric conversion elements may be arranged in a matrix on the substrate, and the metal layer may be formed in a position where the metal layer overlaps in a plan view at least one of photoelectric conversion elements, arranged in an external edge region of the substrate, out of the photoelectric conversion elements (second configuration). According to the second configuration, the metal layer may be formed as a frame in a plan view (third configuration).

The second and third configurations may preclude the metal layer from shading the photoelectric conversion elements, arranged in a central region used to image, out of the multiple photoelectric conversion elements. As a result, the metal layer may be precluded from affecting the imaging performance of the photoelectric conversion panel.

According to the second or third configuration, the photoelectric conversion panel may further include a transparent electrode that is formed on the light incident side of the photoelectric conversion elements and arranged in a position where the transparent electrode overlaps in a plan view at least one of photoelectric conversion elements, arranged inside an inner area defined by an inner edge of the external edge region, out of the photoelectric conversion elements (fourth configuration).

According to the fourth configuration, the photoelectric conversion elements arranged inside an inner area defined by an inner edge of the external edge region may be protected from static electricity by the transparent electrode.

In the fourth configuration, the transparent electrode may be formed on or above the metal layer to cover at least part of the metal layer (fifth configuration).

According to the fifth configuration, since the transparent electrode is formed on or above the metal layer, the transparent electrode and the metal layer may reliably preclude the transistors or the photoelectric conversion elements on the substrate from being damaged by static electricity.

According to one of the first through fifth configurations, the photoelectric conversion panel may further include a bias line that is connected to the photoelectric conversion elements and formed beneath or below the metal layer, wherein the metal layer is connected to the bias line (sixth configuration).

According to the sixth configuration, even when static electricity enters one of the metal layer and the bias line, the static electricity may be diffused to the other of the metal layer and the bias line.

According to one of the first through fifth configurations, the photoelectric conversion panel may further include a bias line connected to the photoelectric conversion elements, wherein the metal layer is formed on a layer identical to a layer of the bias line (seventh configuration).

According to the seventh configuration, since a new metal layer is not added in addition to a layer forming the bias lines, an increase in the number of layers and an increase in the number of manufacturing steps may be controlled. As a result, costs involved in manufacturing the photoelectric conversion panel may be reduced.

An X-ray panel according to an eighth configuration includes the photoelectric conversion panel according to one of the first through seventh configurations and a scintillator that emits fluorescence when the scintillator is irradiated with X rays, wherein the metal layer is arranged between the photoelectric conversion elements and the scintillator (eight configuration).

According to the eighth configuration, even when static electricity occurs in the film formation of the scintillator, the metal layer may protect the photoelectric conversion elements from the static electricity.

An imaging apparatus according to a ninth configuration includes the photoelectric conversion panel according to one of the first through seventh configurations and a detector that detects a leakage current of at least one of the photoelectric conversion elements arranged in a position where the photoelectric conversion elements overlap the metal layer in a plan view (ninth configuration).

According to the ninth configuration, the leakage current of the photoelectric conversion elements shaded by the metal layer may be detected. As a result, the photoelectric conversion panel may be examined in accordance with the leakage current.

In the imaging apparatus according to the ninth configuration, the photoelectric conversion panel may further include a plurality of data lines respective connected to the transistors and a correction control unit that corrects a height of a voltage applied to the data lines in accordance with a magnitude of the leakage current detected by the detector (tenth configuration).

The leakage current of the photoelectric conversion elements varies depending on the characteristics and aging of the photoelectric conversion elements. According to the tenth configuration, the height of the voltage applied to the data lines is corrected in response to the leakage current. The effect of the characteristics and aging of the photoelectric conversion elements on the imaging performance may be reduced.

According the eighth and ninth configurations, the imaging apparatus may further include an X-ray source that emits X-rays and a scintillator that emits fluorescence when the scintillator is irradiated with the X rays emitted from the X-ray source, wherein when the X rays are emitted from the X-ray source, the detector detects the leakage current of at least one of photoelectric conversion elements that are arranged in a position where the photoelectric conversion elements overlap the metal layer in the plan view (eleventh configuration).

The X rays emitted by the X-ray source and transmitted through the metal layer may affect a threshold voltage of the transistors. According to the eleventh configuration, since the leakage current is detected in response to the data signal with the X rays emitted, the effect of the X rays may be detected by detecting the leakage current. If the eleventh configuration is combined with the tenth configuration, the effect of the X rays may be corrected. The effect of the characteristics and aging of the photoelectric conversion elements on the imaging performance may thus be reduced.

The present disclosure contains subject matter related to that disclosed in Japanese Priority Patent Application JP 2021-093795 filed in the Japan Patent Office on Jun. 3, 2021, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A photoelectric conversion panel comprising:
  a substrate;
  a plurality of transistors formed on the substrate;
  a plurality of photoelectric conversion elements respectively connected to the plurality of transistors;
  a metal layer that is formed on a light incident side of the plurality of photoelectric conversion elements and arranged in a position where the metal layer overlaps a subset of the plurality of photoelectric conversion elements in a plan view; and
  a transparent electrode that is formed on the light incident side of the plurality of photoelectric conversion elements and arranged in a position where the transparent layer overlaps, in the plan view, at least one of the plurality of photoelectric conversion elements, arranged inside an inner area defined by an inner edge of an external edge region of the substrate, out of the plurality of photoelectric conversion elements,
  wherein the plurality of photoelectric conversion elements is arranged in a matrix on the substrate, and
  the metal layer is formed in a position where the metal layer overlaps, in the plan view, the at least one of the plurality of photoelectric conversion elements, arranged in the external edge region of the substrate, out of the plurality of photoelectric conversion elements.

2. The photoelectric conversion panel according to claim 1, wherein the metal layer is formed in a shape of a frame in the plan view.

3. The photoelectric conversion panel according to claim 1, wherein the transparent electrode is formed on or above the metal layer to cover at least part of the metal layer.

4. The photoelectric conversion panel according to claim 1, further comprising a bias line connected to the plurality of photoelectric conversion elements, wherein the metal layer is formed integrally with the bias line.

5. An X-ray panel comprising:
  the photoelectric conversion panel according to claim 1; and
  a scintillator that emits fluorescence when the scintillator is irradiated with X rays,
  wherein the metal layer is arranged between the plurality of photoelectric conversion elements and the scintillator.

6. An imaging apparatus comprising:
  the photoelectric conversion panel according to claim 1; and
  a detector that detects a leakage current of at least one of the plurality of photoelectric conversion elements arranged in a position where the plurality of photoelectric conversion elements overlaps the metal layer in the plan view.

7. The imaging apparatus according to claim 6, wherein the photoelectric conversion panel further comprises:
  a plurality of data lines respectively connected to the plurality of transistors; and
  a correction control unit that corrects a height of a voltage applied to the plurality of data lines in accordance with a magnitude of the leakage current detected by the detector.

8. The imaging apparatus according to claim 6, further comprising an X-ray source that emits X rays and a scintillator that emits fluorescence when the scintillator is irradiated with the X rays emitted from the X-ray source, wherein when the X rays are emitted from the X-ray source, the detector detects the leakage current of the at least one of the plurality of photoelectric conversion elements that is arranged in the position where the plurality of photoelectric conversion elements overlaps the metal layer in the plan view.

9. A photoelectric conversion panel comprising:
  a substrate;
  a plurality of transistors formed on the substrate;
  a plurality of photoelectric conversion elements respectively connected to the plurality of transistors; and
  a metal layer that is formed on a light incident side of the plurality of photoelectric conversion elements and arranged in a position where the metal layer overlaps a subset of the plurality of photoelectric conversion elements in a plan view; and
  a bias line that is connected to the plurality of photoelectric conversion elements and formed beneath or below the metal layer, wherein the metal layer is connected to the bias line.

* * * * *